(12) United States Patent
Xu et al.

(10) Patent No.: US 11,039,547 B2
(45) Date of Patent: Jun. 15, 2021

(54) SERVER

(71) Applicants: Inventec (Pudong) Technology Corporation, Shanghai (CN); INVENTEC CORPORATION, Taipei (TW)

(72) Inventors: Ji-Peng Xu, Shanghai (CN); Shi-Min Hong, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 128 days.

(21) Appl. No.: 16/565,875

(22) Filed: Sep. 10, 2019

(65) Prior Publication Data
US 2021/0068294 A1  Mar. 4, 2021

(30) Foreign Application Priority Data
Sep. 3, 2019 (CN) .......................... 201910827546.7

(51) Int. Cl.
| | |
|---|---|
| *H05K 7/14* | (2006.01) |
| *G06F 1/18* | (2006.01) |
| *H05K 7/20* | (2006.01) |
| *G06F 1/26* | (2006.01) |
| *G11B 33/02* | (2006.01) |

(52) U.S. Cl.
CPC .......... *H05K 7/1487* (2013.01); *G06F 1/181* (2013.01); *G06F 1/187* (2013.01); *H05K 7/1491* (2013.01); *H05K 7/1492* (2013.01); *H05K 7/20727* (2013.01); *G06F 1/189* (2013.01); *G06F 1/26* (2013.01); *G11B 33/022* (2013.01)

(58) Field of Classification Search
CPC .. H05K 7/1487; H05K 7/1491; H05K 7/1492; H05K 7/20727; G06F 1/181; G06F 1/187
See application file for complete search history.

(56) References Cited

U.S. PATENT DOCUMENTS

| | | | |
|---|---|---|---|
| 9,179,572 B2* | 11/2015 | Li ........................ | H05K 7/1487 |
| 9,402,328 B2* | 7/2016 | Xu ..................... | H05K 7/20727 |
| 9,763,362 B1* | 9/2017 | Xu ........................ | G11B 33/128 |
| 2013/0141863 A1* | 6/2013 | Ross .................... | G11B 33/128 |
| | | | 361/679.33 |

(Continued)

*Primary Examiner* — Nidhi Thaker
(74) *Attorney, Agent, or Firm* — Locke Lord LLP; Tim Tingkang Xia, Esq.

(57) ABSTRACT

The disclosure provides a server, including a casing, a host assembly, a data storage assembly and a power supply assembly. The casing includes a bottom plate, a first side plate, a second side plate and a straight partition. The first side plate, the second side plate and the straight partition are connected to the bottom plate. The first side plate and the second side plate are respectively located at two opposite sides of the bottom plate. The straight partition is located between the first side plate and the second side plate. The host assembly is slidably disposed on the second side plate and the straight partition. The data storage assembly is slidably disposed on the first side plate and the straight partition. The power supply assembly is located between the first side plate and the straight partition and electrically connected to the host assembly and the data storage assembly.

9 Claims, 3 Drawing Sheets

(56) References Cited

U.S. PATENT DOCUMENTS

| | | | | |
|---|---|---|---|---|
| 2013/0155600 A1* | 6/2013 | Ross | ............... | H05K 7/1487 361/679.31 |
| 2014/0293523 A1* | 10/2014 | Jau | ............... | H05K 7/1487 361/679.4 |
| 2015/0243140 A1* | 8/2015 | Barrett | ............... | G06F 1/182 340/815.4 |
| 2016/0165742 A1* | 6/2016 | Shen | ............... | G06F 1/187 361/679.37 |
| 2018/0249589 A1* | 8/2018 | Chen | ............... | H05K 7/1489 |

* cited by examiner

SERVER

CROSS-REFERENCE TO RELATED APPLICATIONS

This non-provisional application claims priority under 35 U.S.C. § 119(a) on Patent Application No(s). 201910827546.7 filed in China on Sep. 3, 2019 the entire contents of which are hereby incorporated by reference.

BACKGROUND OF THE INVENTION

Technical Field of the Invention

The disclosure relates to a server, more particularly a server having a host assembly and a data storage assembly.

Description of the Related Art

As the computer technology progresses, desktop computers, laptop computers or other types of portable computer are widely used in daily life. In addition to the advancement of the communication technology, cross-border e-commerce becomes a major trend. Personal computers are not sufficient to process a massive amount of data generated in the global e-commerce market. As a result, a server (e.g., a rack server, a blade server or tower server) is provided.

Conventionally, a server can have a single function for performing computation or data storing or can have multiple functionalities for providing more than one of the aforementioned services. It is understood that the multi-functional server should contain more amount of electrical or electronic devices than the uni-functional server in order to achieve multiple functionalities, such that the arrangement of the internal components of the multi-functional server is much more compact.

SUMMARY OF THE INVENTION

One embodiment of the disclosure provides a server. The server includes a casing, a host assembly, a data storage assembly and a power supply assembly. The casing includes a bottom plate, a first side plate, a second side plate and a straight partition. The first side plate, the second side plate and the straight partition are connected to a same surface of the bottom plate, the first side plate and the second side plate are respectively located at two opposite sides of the bottom plate, and the straight partition is located between the first side plate and the second side plate. The host assembly is located between and slidably disposed on the second side plate and the straight partition. The data storage assembly is located between and slidably disposed on the first side plate and the straight partition. The power supply assembly is located between the first side plate and the straight partition and electrically connected to the host assembly and the data storage assembly.

BRIEF DESCRIPTION OF THE DRAWINGS

The present disclosure will become more fully understood from the detailed description given hereinbelow and the accompanying drawings which are given by way of illustration only and thus are not limitative to the present disclosure and wherein.

DETAILED DESCRIPTION

Figure 1:
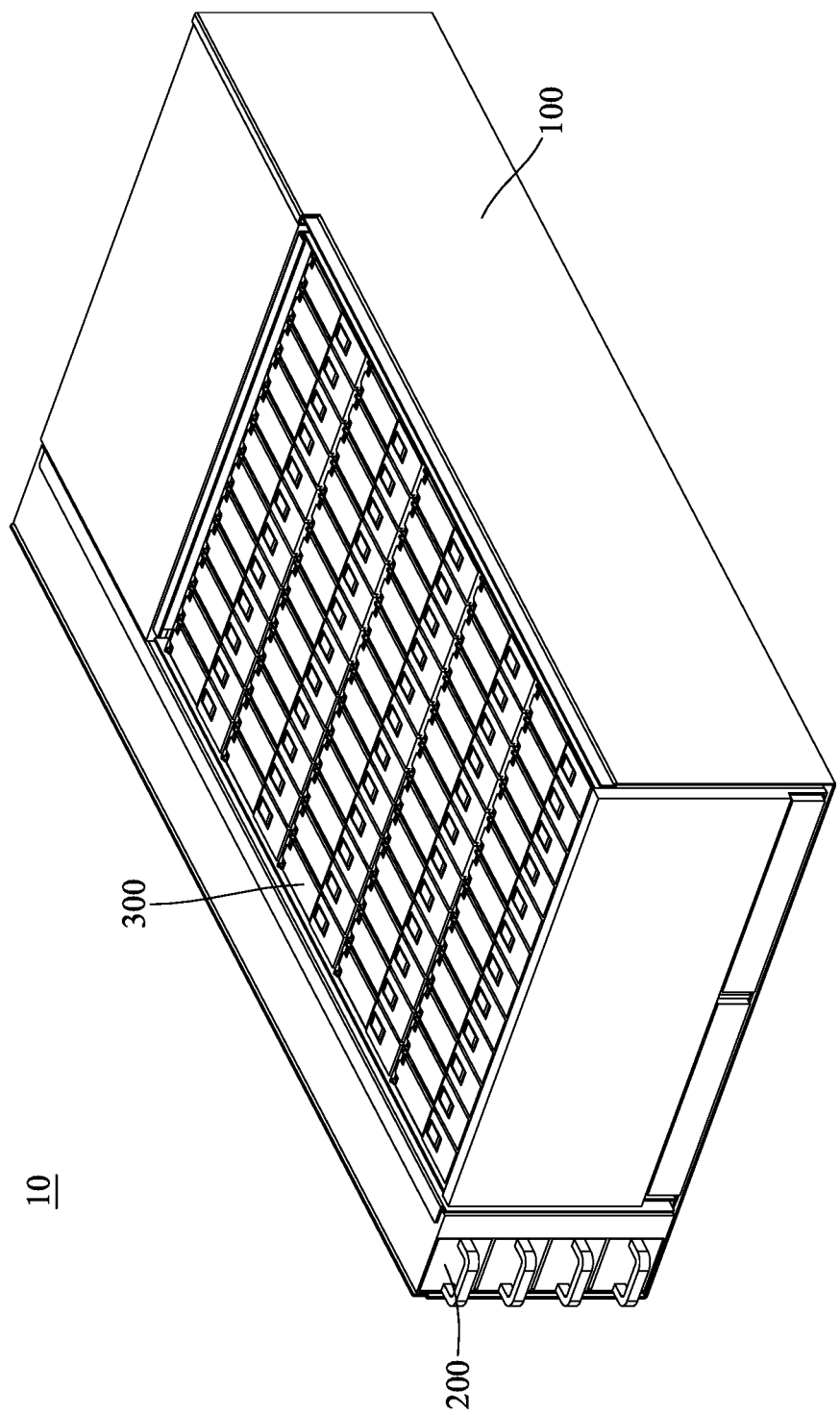
FIG. 1 is a perspective view of a server of one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, reference lines or buses are omitted in some of the figures.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
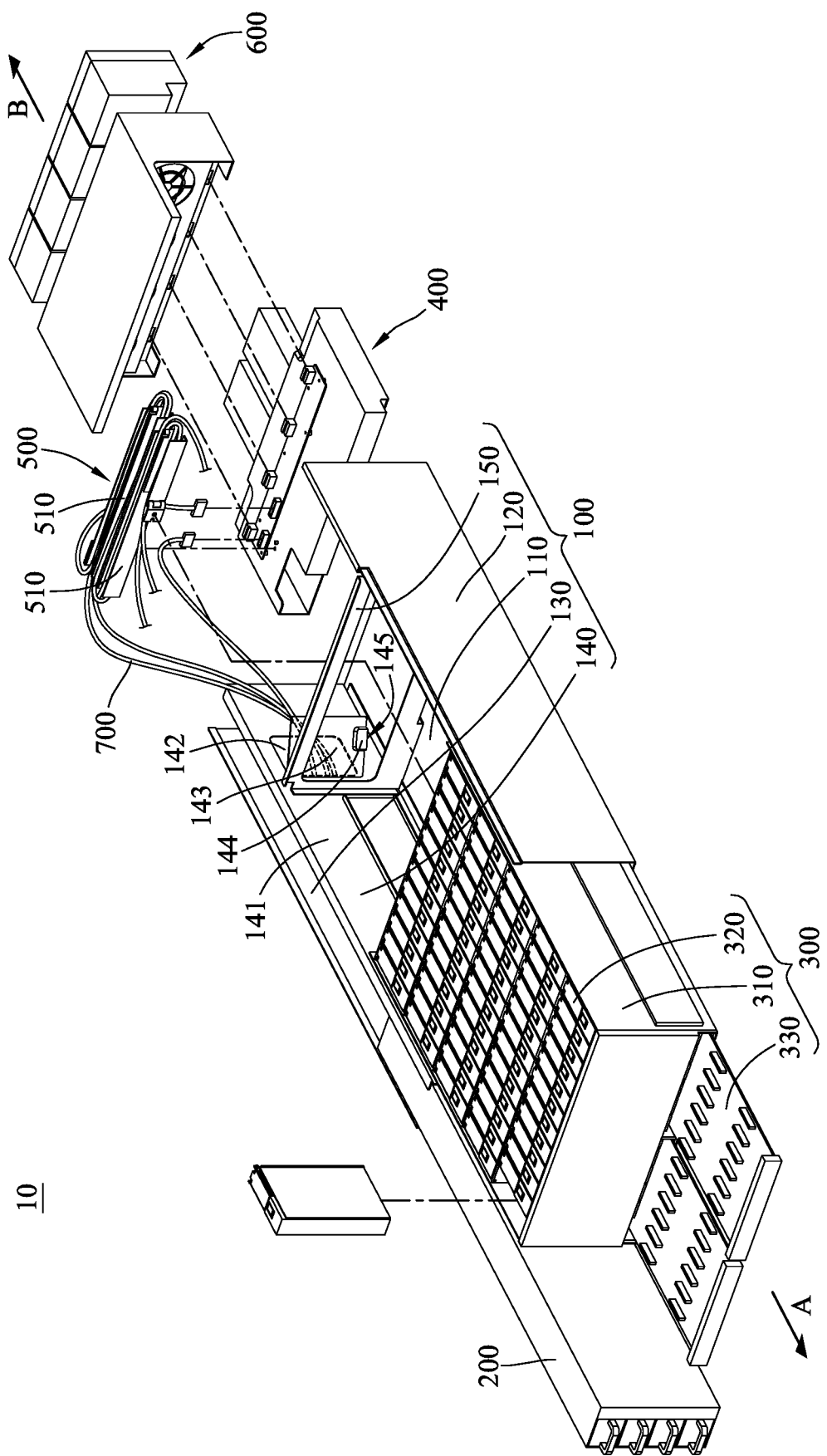
FIG. 2 is an exploded view of the server in FIG. 1.
Figure 3:
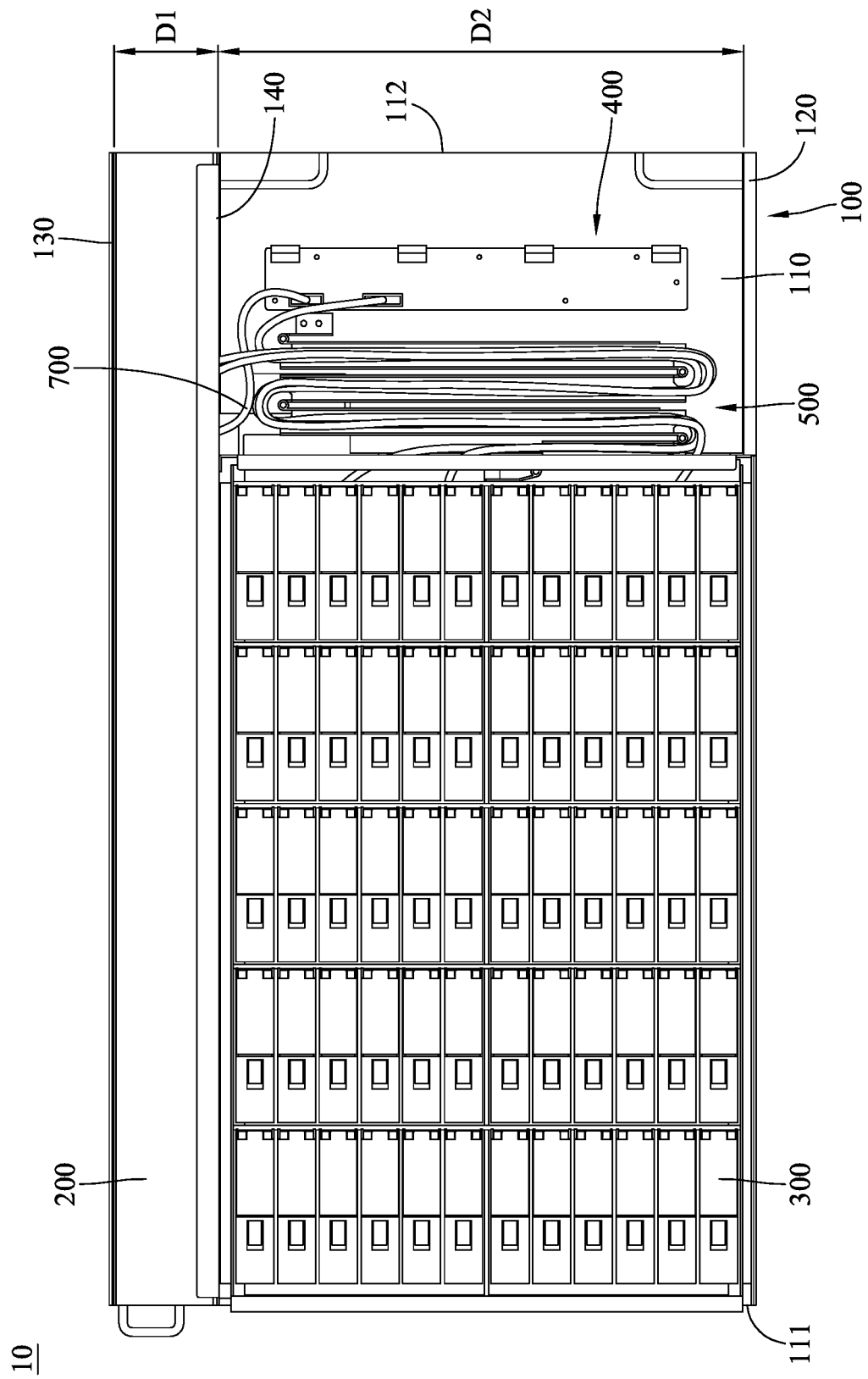
FIG. 3 is a top view of the server in FIG. 1.

Referring to FIGS. 1 to 3, FIG. 1 is a perspective view of a server 10 of one embodiment of the disclosure, FIG. 2 is an exploded view of the server 10 in FIG. 1, and FIG. 3 is a top view of the server 10 in FIG. 1.

In this embodiment, the server 10 is, for example, a 4U server. The server 10 includes a casing 100, a host assembly 200, a data storage assembly 300 and a power supply assembly 400. In addition, the server 10 may further include a cable arrangement assembly 500 and a fan assembly 600.

The casing 100 includes a bottom plate 110, a first side plate 120, a second side plate 130 and a straight partition 140.

The bottom plate 110 has a front edge 111 and a rear edge 112 opposite to each other. The first side plate 120, the second side plate 130 and the straight partition 140 are all connected to the same surface of the bottom plate 110, and the first side plate 120, the second side plate 130 and the straight partition 140 all extend, for example, from the front edge 111 to the rear edge 112. The first side plate 120 and the second side plate 130 are respectively located at two opposite sides of the bottom plate 110, and the straight partition 140 is located between the first side plate 120 and the second side plate 130. A distance D1 between the second side plate 130 and the straight partition 140 is smaller than a distance D2 between the first side plate 120 and the straight partition 140. The straight partition 140 includes a main plate part 141 and a door part 143. The main plate part 141 is connected to the bottom plate 110 and has an opening 142. The door part 143 is pivotably disposed on the main plate part 141 so as to close or open the opening 142. When the door part 143 is opened, two spaces respectively located at two opposite of sides of the main plate part 141 are connected to each other via the opening 142. When the door part 143 is closed, these two spaces respectively located at the two opposite sides of the main plate part 141 are not connected to each other. The casing 100 further includes a transverse partition 150. The transverse partition 150 is located between and connected to the first side plate 120 and the straight partition 140.

The host assembly 200 includes, for example, a housing, a processing unit and a heat dissipation unit (not shown).

The host assembly 200 is located between and slidably disposed on the second side plate 130 and the straight partition 140, such that the host assembly 200 is slidable along a direction A with respect to the casing 100. Referring to FIG. 2, the host assembly 200 is allowed to be drawn out from the casing 100.

The data storage assembly 300 is located between and slidably disposed on the first side plate 120 and the straight partition 140. The data storage assembly 300 is also slidable along the direction A with respect to the casing 100 and is allowed to be drawn out from the casing 100. The data storage assembly 300 includes a carrier 310, a plurality of hard disk drives 320 and two circuit boards 330. The carrier 310 is slidably disposed on the casing 100. The hard disk drives 320 are configured to store data. The hard disk drives 320 are removably stored in the carrier 310 so as to be located between the first side plate 120 and the straight partition 140. The hard disk drives 320 are arranged in an array arrangement. The two circuit boards 330 are located between the hard disk drives 320 and the bottom plate 110. The circuit boards 330 are slidably disposed on the carrier 310, and the circuit boards 330 are also slidable along the direction A and is allowed to be drawn out from the carrier 310.

The power supply assembly 400 is disposed between the first side plate 120 and the straight partition 140 and is electrically connected to the host assembly 200 and the data storage assembly 300 for providing electricity to the host assembly 200 and the data storage assembly 300. Furthermore, the data storage assembly 300 and the power supply assembly 400 are respectively located at two opposite sides of the transverse partition 150, and the power supply assembly 400 is slidable along a direction B opposite to the direction A and is allowed to be drawn out from the casing 100.

The cable arrangement assembly 500 includes a plurality of arm parts 510, where one of the arm parts 510 is pivotally connected to one or two of adjacent arm parts 510. The outermost arm parts 510 of the cable arrangement assembly 500 are respectively fixed to the bottom plate 110 of the casing 100 and the carrier 310 of the data storage assembly 300.

The fan assembly 600 is located at a side of the power supply assembly 400 away from the transverse partition 150, and the fan assembly 600 is slidably disposed on the casing 100. The fan assembly 600 is slidable along the direction B with respect to the casing 100 and is allowed to be drawn out from the casing 100.

In this embodiment, there are wires 700 located inside the server 10. For example, some of the wires 700 are disposed through the opening 142 of the main plate part 141 so as to be partially located at the two opposite sides of the main plate part 141, and electrically connect the host assembly 200 to the power supply assembly 400, or electrically connect the host assembly 200 to the data storage assembly 300. The other wires 700 are located at the same side of the main plate part 141 with the data storage assembly 300 and electrically connect the data storage assembly 300 to the power supply assembly 400.

When the door part 143 is opened, the opening 142 of the main plate part 141 helps the wires 700 to electrically connect the host assembly 200 to the power supply assembly 400 or connect the host assembly 200 to the data storage assembly 300. In addition, the door part 143 has, for example, a hollow bump structure 144. The hollow protrusion structure 144 forms a hole 145 connected to the two space located at two opposite of the main plate part 141. The hole 145 formed by the hollow bump structure 144 allows different parts of the wires 700 to be respectively located at two opposite sides of the main plate part 141 and prevents the wires 700 from being interfered with the door part 143 when the door part 143 is closed.

Moreover, in this embodiment, the wires 700 between the host assembly 200 and the power supply assembly 400, between the host assembly 200 and the data storage assembly 300, or between the data storage assembly 300 and the power supply assembly 400 are arranged on the arm parts 510 of the cable arrangement assembly 500 so as to be maintained in a well-organized manner. During the movement of the data storage assembly 300 or the power supply assembly 400 along the direction A or B, the data storage assembly 300 or the power supply assembly 400 folds or unfolds the arm parts 510, and the wires 700 are moved with the arm parts 510.

As the aforementioned internal configuration of the 4U server 10 as discussed above, the inner space of the server 10 not only can accommodate both the host assembly 200 and the data storage assembly 300, but also accommodate a large amount of hard disk drive 320. In this embodiment, the server 10 can accommodate a total of 60 hard disk drives 320 of 3.5-inch.

In addition, the host assembly 200 is partitioned from the data storage assembly 300, the power supply assembly 400 and the fan assembly 600 by the straight partition 140, such that the host assembly 200, the data storage assembly 300, the power supply assembly 400 and the fan assembly 600 can be designed to be slidable, which makes the maintenance, repair or replacement of the host assembly 200, the data storage assembly 300, the power supply assembly 400 and the fan assembly 600 easy and convenient to the user.

According to the server as discussed above, as the aforementioned internal configuration of the server, the inner space of the server not only can accommodate both the host assembly and the data storage assembly, but also accommodate a large amount of hard disk drive.

In addition, the host assembly is partitioned from the data storage assembly, the power supply assembly and the fan assembly by the straight partition, such that the host assembly, the data storage assembly, the power supply assembly and the fan assembly can be designed to be slidable, which makes the maintenance, repair or replacement of the host assembly, the data storage assembly, the power supply assembly and the fan assembly easy and convenient to the user.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server, comprising:
 a casing, comprising a bottom plate, a first side plate, a second side plate and a straight partition, wherein the first side plate, the second side plate and the straight partition are connected to a same surface of the bottom plate, the first side plate and the second side plate are respectively located at two opposite sides of the bottom plate, and the straight partition is located between the first side plate and the second side plate;
 a host assembly, wherein the host assembly is located between and slidably disposed on the second side plate and the straight partition;

a data storage assembly, wherein the data storage assembly is located between and slidably disposed on the first side plate and the straight partition; and a power supply assembly, wherein the power supply assembly is located between the first side plate and the straight partition and electrically connected to the host assembly and the data storage assembly;

wherein the straight partition comprises a main plate part and a door part, the main plate part is connected to the bottom plate, the door part is pivotably disposed on the main plate part so as to allow two spaces which are respectively located at two opposite sides of the main plate part to be or not to be connected to each other.

2. The server according to claim 1, wherein the data storage assembly comprises a carrier, a plurality hard disk drives and two circuit boards, the carrier is slidably disposed on casing, the plurality of hard disk drives are removably stored in the carrier so as to be located between the first side plate and the straight partition, the plurality of hard disk drives are arranged in an array arrangement, and the two circuit boards are located between the plurality of hard disk drives and the bottom plate.

3. The server according to claim 2, wherein the two circuit boards is slidably disposed on the carrier, and the two circuit boards and the carrier are slidable along a same direction to be drawn out from the casing.

4. The server according to claim 2, further comprising a cable arrangement assembly, wherein the cable arrangement assembly comprises a plurality of arm parts, one of the plurality of arm parts is pivotably connected to one or adjacent two of the plurality of arm parts, two opposite ends of the cable arrangement assembly are respectively fixed to the bottom plate of the casing and the carrier of the data storage assembly.

5. The server according to claim 1, wherein the casing further comprises a transverse partition, the transverse partition is located between and connected to the first side plate and the straight partition, and the data storage assembly and the power supply assembly are respectively located at two opposite sides of the transverse partition.

6. The server according to claim 5, further comprising a fan assembly, wherein the fan assembly located at a side of the power supply assembly away from the transverse partition, and the fan assembly is slidably disposed on the casing.

7. The server according to claim 6, wherein the fan assembly and the data storage assembly are slidable along two opposite directions to be drawn out from the casing, and the host assembly and the data storage assembly are slidable along a same direction to be drawn out from the casing.

8. The server according to claim 1, wherein a distance between the second side plate and the straight partition is smaller than a distance between the first side plate and the straight partition.

9. The server according to claim 1, wherein the bottom plate has a front edge and a rear edge opposite to each other, the first side plate, the second side plate and the straight partition all extend from the front edge to the rear edge.

* * * * *